(12) United States Patent
Baeckler et al.

(10) Patent No.: US 9,100,031 B1
(45) Date of Patent: *Aug. 4, 2015

(54) METHOD AND SYSTEM FOR DYNAMIC TABLE LINE ENCODING

(71) Applicant: Altera Corporation, San Jose, CA (US)

(72) Inventors: Gregg William Baeckler, San Jose, CA (US); David W. Mendel, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 12 days.

This patent is subject to a terminal disclaimer.

(21) Appl. No.: 14/148,116

(22) Filed: Jan. 6, 2014

Related U.S. Application Data

(63) Continuation of application No. 13/563,533, filed on Jul. 31, 2012, now Pat. No. 8,638,245.

(51) Int. Cl.
*H03M 7/00* (2006.01)
*H03M 7/02* (2006.01)

(52) U.S. Cl.
CPC .................................... *H03M 7/02* (2013.01)

(58) Field of Classification Search
CPC ................................. H03M 7/02; H03M 7/14
USPC .............................................. 341/55, 58, 106
See application file for complete search history.

(56) References Cited

U.S. PATENT DOCUMENTS

| | | | |
|---|---|---|---|
| 4,387,364 A | 6/1983 | Shirota | |
| 5,025,256 A | 6/1991 | Stevens | |
| 5,387,911 A | 2/1995 | Gleichert et al. | |
| 6,278,740 B1 | 8/2001 | Nordyke | |
| 6,703,949 B2 | 3/2004 | Greenstreet | |
| 7,262,715 B2 * | 8/2007 | Sagar | 341/55 |
| 7,307,554 B2 | 12/2007 | Kojima | |
| 7,339,500 B2 * | 3/2008 | Noda | 341/50 |
| 2011/0051854 A1 | 3/2011 | Kizer et al. | |

OTHER PUBLICATIONS

Notice of Allowance for U.S. Appl. No. 13/563,533 mailed Sep. 23, 2013.

* cited by examiner

*Primary Examiner* — Khai M Nguyen
(74) *Attorney, Agent, or Firm* — Weaver Austin Villeneuve & Sampson LLP

(57) ABSTRACT

Disclosed are systems, apparatus, and methods for encoding data transmitted in a data line. In various embodiments, a device may include a first input port operative to receive a first data value. In some embodiments, the device may further include a first memory device operative to look up a second data value based on the first data value, where the second data value is a representation of the first data value encoded according to an encoding scheme that allows clock recovery, and where the memory device is operative to be configured according to a plurality of line encoding schemes. In various embodiments, the device may further include a first output port operative to provide an output signal, where the output signal comprises one or more data values including the second data value.

22 Claims, 5 Drawing Sheets

METHOD AND SYSTEM FOR DYNAMIC TABLE LINE ENCODING

PRIORITY DATA

This application is a continuation of U.S. patent application Ser. No. 13/563,533, titled METHOD AND SYSTEM FOR DYNAMIC TABLE LINE ENCODING, by Gregg William Baeckler et al., filed on Jul. 31, 2012, which is incorporated by reference herein in its entirety and for all purposes.

TECHNICAL FIELD

The present disclosure generally relates to integrated circuits. More specifically, the present disclosure relates to techniques and systems for encoding data transmitted and received by integrated circuits.

DESCRIPTION OF RELATED ART

A high speed serial channel may be used to transmit data from a transmitter of a first transceiver to a receiver of a second transceiver. The receiver may use a clock recovery circuit to recover a clock signal from the incoming data stream. The transmission of data across a high speed serial channel often utilizes an encoding scheme to create toggling activity that is sufficient for the receiver to recover a clock signal from a data stream and use the clock signal to gate the incoming data. Exemplary encoding schemes may be 8b10b, Interlaken 64-67, Peripheral Component Interconnect Express (PCIE), and Ethernet 64-66. Such encoding schemes may take a data value, such as a binary number, and map the data value to a symbol, which may be a binary data value including ones and zeros that are interspersed to ensure the presence of sufficient toggling activity. Thus, a value of zero would ordinarily comprise a binary number with data values of all zeros (i.e. "00000"), which would have no toggling activity that can be used for clock recovery. However, zero may be mapped to a symbol comprising the data values of "10111" which may include sufficient toggling activity.

Conventional methods and apparatus for implementing an encoding scheme may use fixed logic or hardware to configure a transceiver to operate in accordance with a particular encoding scheme. Thus, if an encoding scheme is changed, the entire channel must be taken offline so that the device may be reconfigured and the logic updated or replaced. Moreover, if the channel is part of a multichannel device, such as a multichannel transceiver, the entire device must be taken offline. Thus, multiple channels or data lines may be taken offline in order to reconfigure one channel. Furthermore, because the fixed logic used to encode the data must be replaced while offline, reconfiguration of the encoding scheme used by a channel can not be done in real time and while the transceiver is operational.

OVERVIEW

In various embodiments, a device may include a first input port operative to receive a first data value. In some embodiments, the device may further include, a first memory device operative to look up a second data value based on the first data value, where the second data value is a representation of the first data value encoded according to an encoding scheme that allows clock recovery, and where the memory device is operative to be configured according to a plurality of line encoding schemes. In various embodiments, the device may further include a first output port operative to provide an output signal, wherein the output signal comprises one or more data values including the second data value.

According to various embodiments, the encoded representation of the first data value is encoded according to a line encoding scheme. In some embodiments, the memory device is operative to be configured from a first line encoding scheme to a second line encoding scheme, where the first line encoding scheme is selected from the group consisting of: 8b10b, Interlaken 64-67, Peripheral Component Interconnect Express (PCIE), and Ethernet 64-66, and where the second line encoding scheme is different from the first line encoding scheme. In particular embodiments, the memory device is comprised of a random access memory (RAM) or a plurality of RAMs including composition logic. According to some embodiments, the first output port is a link in a transceiver. In various embodiments, the device further comprises a second input port, a second memory device, and a second output port. In some embodiments, the first memory device and the second memory device are operative to look up data values according to a first encoding scheme and a second encoding scheme. In particular embodiments, the first encoding scheme is different from the second encoding scheme. According to various embodiments, the device further comprises a processor, where the processor is operative to implement an encoding scheme in the first memory device based on a transmission error rate associated with the output signal. In some embodiments, the transmission error rate is a bit error rate.

In another aspect, a method may receive a first data value at a first input port of a memory device. In some embodiments, the method may identify a second data value based on the first data value, where the second data value is a representation of the first data value encoded according to an encoding scheme that allows clock recovery, and where the memory device is operative to be configured according to a plurality of line encoding schemes. In various embodiments, the method may provide one or more data values including the second data value at a first output port of the memory device.

In various embodiments, the encoded representation of the first data value is encoded according to a first encoding scheme. In particular embodiments, the method further comprises reconfiguring the memory device to operate in accordance with a second encoding scheme. According to various embodiments, the method further comprises reconfiguring the memory device to operate in accordance with a third encoding scheme and determining whether the first, second, or third encoding scheme results in a lowest bit error rate. In some embodiments, the method further comprises reconfiguring the memory device to operate in accordance with the determined encoding scheme. In particular embodiments, the method further comprises detecting a data transmission error at a receiver, where the receiver is operative to receive the one or more data values from the first output port of the memory device, recording a data value and first symbol associated with the data transmission error, identifying a total number of errors associated with the symbol, and associating a second symbol with the first data value.

In another aspect, a non-transitory computer readable storage medium may have computer code embodied therein, the computer readable storage medium comprising computer code for receiving a first data value at a first input port of a memory device. In various embodiments, the non-transitory computer readable storage medium may further comprise computer code for identifying a second data value based on the first data value, where the second data value is a representation of the first data value encoded according to an encoding scheme that allows clock recovery, and where the memory device is operative to be configured according to a plurality of line encoding schemes. In some embodiments, the non-transitory computer readable storage medium may further comprise computer code for providing one or more data values including the second data value at a first output port of the memory device.

In various embodiments, the encoded representation of the first data value is encoded according to a first encoding scheme. In some embodiments, the non-transitory computer readable storage medium may further comprise computer code for reconfiguring the memory device to operate in accordance with a second encoding scheme, computer code for reconfiguring the memory device to operate in accordance with a third encoding scheme, and computer code for determining whether the first, second, or third encoding scheme results in a lowest bit error rate. In particular embodiments, the non-transitory computer readable storage medium may further comprise computer code for detecting a data transmission error at a receiver, wherein the receiver is operative to receive the one or more data values from the first output port of the memory device, computer code for recording a data value and first symbol associated with the data transmission error, computer code for identifying a total number of errors associated with the symbol, and computer code for associating a second symbol with the first data value.

DESCRIPTION OF PARTICULAR EMBODIMENTS

Figure 1:
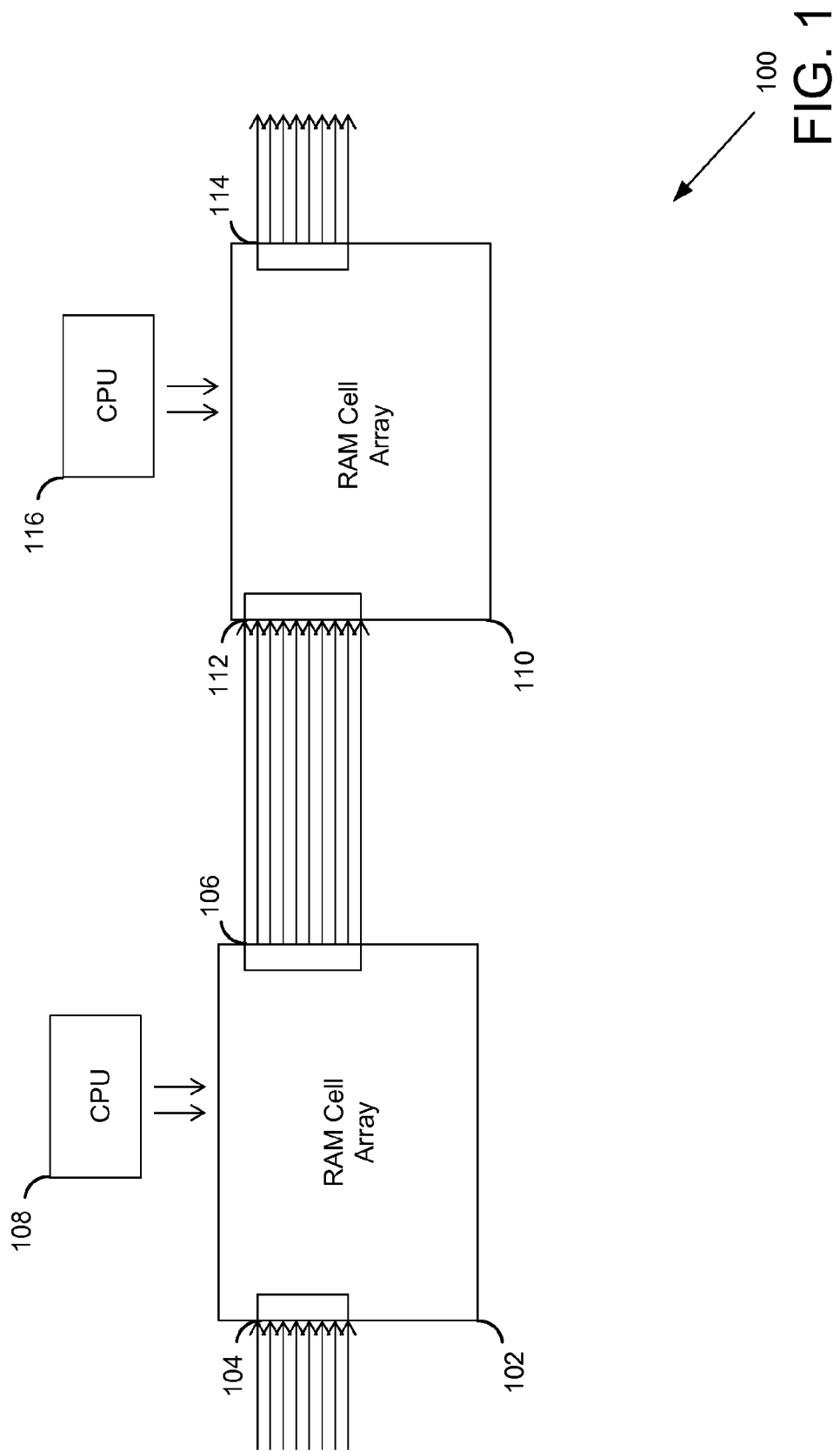
FIG. 1 illustrates an exemplary circuit 100 capable of transmitting encoded data over a data line, implemented in accordance with some embodiments.

Reference will now be made in detail to embodiments of the present invention. Examples of these embodiments are illustrated in the accompanying drawings. While the invention is described in conjunction with these embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques and mechanisms of the present invention will be described in the context of particular types of devices. However, it should be noted that the techniques and mechanisms of the present invention apply to a variety of different types of devices. In the following description, numerous specific details are set forth in order to provide a thorough understanding of the present invention. Particular exemplary embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that various embodiments may include multiple iterations of a technique or multiple instantiations of a mechanism unless noted otherwise. For example, a system may use a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to a memory component, but it will be appreciated that a variety of bridges and controllers may reside between the processor and memory. Consequently, a connection does not necessarily mean a direct, unimpeded connection unless otherwise noted.

In various embodiments, a programmable memory device may be included in one or more components in a data transmission line to enable dynamic configuration of the components to implement an encoding scheme utilized for data transmission. In some embodiments, a data transmission line may be a connection between a transmitter in a first transceiver and a receiver in a second transceiver. In particular embodiments, the first transceiver may be one of many rack-mounted transceivers mounted in a rack. Furthermore, the first transceiver may be a multichannel device that includes multiple transmitters capable of transmitting information on multiple channels. The same may be true for the receiver.

According to various embodiments, a programmable memory, such as a random access memory (RAM), may be included in a transmitter used to send data, and included in a receiver used to receive the data. In various embodiments the RAM may be configured as a lookup table that looks up a value based on a received input. In some embodiments, a RAM located in the transmitter may lookup an encoded representation of a data value in response to receiving the data value. In various embodiments, the encoded representation may be encoded according to an encoding scheme. For example, the RAM may receive a data value to be transmitted by the transmitter. The data value may be an eight bit binary number. The RAM may lookup a 10 bit symbol based on an 8b10b encoding scheme and provide the 10 bit symbol to an output port for transmission. In some embodiments, the receiver also includes a RAM that is configured to decode a received value. Thus, the RAM in the receiver may receive an encoded value, and lookup a decoded data value based on the received encoded value. Returning to the previous example, the receiver may receive the 10 bit symbol and lookup the 8 bit decoded data value based on the 8b10b encoding scheme.

In various embodiments, a transmitter and receiver may be configured to identify problematic symbols that result in high error rates and replace them with less problematic symbols. Thus, a computer system may monitor data transmitted over the data line, identify symbols that result in high error rates, and replace or reassign the problematic symbols. In various embodiments, this may be done dynamically while the transmitter and receiver are operational, and without interrupting the transmission of data over the data line or channel.

In some embodiments, a positively biased, neutral, and negatively biased encoding scheme may be used to transmit data in a data transmission line. In various embodiments, a computer system may be configured to record an error rate for each encoding scheme, and determine which encoding scheme results in the lowest data transmission error rate.

Accordingly, the computer system may be configured to identify an encoding scheme that results in the lowest error rate and dynamically implement that particular encoding scheme.

FIG. 1 illustrates an exemplary circuit 100 capable of transmitting encoded data over a data line, implemented in accordance with some embodiments. In various embodiments, circuit 100 may include random access memory (RAM) cell array 102, central processing unit (CPU) 108, RAM cell array 110, and CPU 116. According to various embodiments, circuit 100 may be part of a data transmission line used to send and receive data. Thus, according to various embodiments, RAM cell array 102 and CPU 108 may be included in a transmitter, such as the transmitter of a first transceiver. In some embodiments, RAM cell array 110 and CPU 116 may be included in a receiver, such as the receiver of a second transceiver. In various embodiments, data may be sent from the transmitter to the receiver across a data line, such as a high speed serial channel. As previously discussed, the data may be encoded to ensure an amount of toggling sufficient for clock recovery.

As previously discussed, RAM cell array 102 may be included in a transmitter of a transceiver, and may be configured to operate as a lookup table. Thus, in some embodiments, RAM cell array 102 may receive an input and lookup one or more data values based on the received input. According to some embodiments, RAM cell array 102 may be configured to lookup an encoded value of a received data value. For example, RAM cell array 102 may receive an 8 bit number representing a data value to be transmitted over a data line. In response to receiving the 8 bit number, RAM cell array 102 may be searched for a 10 bit encoded value corresponding to the 8 bit number. In various embodiments, the 10 bit number is a symbol generated in accordance with the 8b10b encoding scheme. RAM cell array 102 may be further configured to provide the 10 bit encoded number as an output. Thus, RAM cell array 102 may function as a lookup table that provides a looked up value in accordance with a particular encoding scheme. In various embodiments, the encoding scheme may be determined based on how RAM cell array 102 is initially configured. For example, as discussed in greater detail below with respect to CPU 108, a processor or controller may be used to implement an encoding scheme in RAM cell array 102 when the transceiver is initially put into use.

In various embodiments, RAM cell array 102 may include input port 104 and output port 108. Thus, RAM cell array 102 may receive an input at input port 104 and provide an output at output port 106 based on the received input. In various embodiments, an un-encoded data value may be received at input port 104. In one example, RAM cell array 102 may be configured to use an 8b10b encoding scheme. In this example, the un-encoded value may be an 8 bit number that is provided to input port 104. RAM cell array 102 may lookup a 10 bit number based on the received 8 bit number and provide the 10 bit number as an output via output port 106. In various embodiments, output port 106 may be coupled to a serializer that serializes the 10 bit number for transmission over a data line.

According to some embodiments, CPU 108 may be a processor or controller operative to configure RAM cell array 102 to implement a particular encoding scheme. Thus, according to various embodiments, CPU 108 may be operative to retrieve an encoding table from a memory device residing in or coupled to the transceiver, and may be further operative to load the encoding table into RAM cell array 102. Once the encoding table is loaded, RAM cell array 102 may be operative to lookup data values in accordance with the relationships specified by the encoding table. In various embodiments, the memory device may be part of or coupled to a computer system. Thus, according to various embodiments, software run on the computer system may be used to configure the encoding schemes stored in the memory device and implemented in in RAM cell array 102.

In various embodiments, RAM cell array 110 may be included in a receiver of a transceiver. In some embodiments, RAM cell array 110 may operate similar to RAM cell array 102 and may be configured as a lookup table. However, instead of encoding an un-encoded data value, RAM cell array 110 may be used to decode an encoded value. Thus, RAM cell array 110 may receive a 10 bit number that has been transmitted over a data line. RAM cell array 110 may be configured to lookup an 8 bit value based on the received 10 bit number. As similarly discussed with reference to RAM cell array 102, RAM cell array 110 may be coupled to a memory device that may be part of or coupled to a computer system. As discussed in greater detail below, a computer implemented software program may be used to configure the encoding schemes stored in the memory device and the encoding schemes implemented in RAM cell array 110.

As similarly discussed with reference to RAM cell array 102, in some embodiments, RAM cell array 110 may include input port 112 and output port 114. In various embodiments, input port 112 may be coupled to a deserializer that deserializes the 10 bit number received from the data line. Thus, RAM cell array 110 may receive an input at input port 112 and provide an output at output port 114 based on the received input. Thus, returning to a previous example, RAM cell array 110 may be configured to use an 8b10b encoding scheme. In this example, an encoded value may be a 10 bit number that is provided to input port 112. RAM cell array 110 may lookup an 8 bit number based on the received 10 bit number and provide the 8 bit number as an output via output port 114.

As similarly discussed with reference to CPU 108, CPU 116 may be a processor or controller operative to configure RAM cell array 110 to implement a particular encoding scheme. Thus, CPU 116 may be operative to retrieve an encoding table from a memory device residing in or coupled to the transceiver, and may be further operative to load the encoding table into RAM cell array 110.

In various embodiments, RAM cell arrays may be stitched together so that more than one RAM cell array is included in either or both of the transmitter and the receiver in the data line. For example, a group of RAMs may be used with composition logic to provide a look up table for an implemented encoding scheme. In some embodiments, each RAM of the group of RAMs may provide a look up for a subset of the bits that collectively comprise a symbol that may be included in the encoding scheme. Thus, a looked up symbol may be identified by different subsets of bits provided by different RAMs. In various embodiments, the symbol may be further identified by logic configured to execute one or more functions, such as arithmetic operations, on the received input signal. In this instance, the bits comprising the symbol are identified by a combination of looked up values retrieved from the RAMs and values provided as an output of combinational logic configured to perform the one or more arithmetic operations on the input signal. In this way, the size of RAM cell arrays may be reduced and the number of RAM cell arrays may be reduced. Moreover, stitching RAM cell arrays together may allow encoding and decoding of values with a bit width larger than that of the lookup table implemented in a RAM cell array. Thus, two or more RAM cell arrays may be used in conjunction as one larger RAM cell array that may be used to encode or decode a large data value.

In some embodiments, the encoding scheme may be configured to have multiple symbols decode to the same data value. Thus, a first symbol and a second symbol may be mapped to and decode to the same data value. Different symbols may be assigned to different data lines in the same device. For example, a first data line may use the first symbol, while a second data line adjacent to the first data line uses the second data symbol. In another example, a plurality of symbols may be mapped to a single data value. A CPU or controller may be configured to assign a symbol of the plurality of symbols to each of the data lines in the device. In various embodiments, the use of different symbols for the transmission of the same data value in adjacent data lines prevents all data lines asserting the same values at the same time and reduces "lane-to-lane" interference, or crosstalk between data lines. Moreover, in some embodiments, each of the plurality of symbols may be assigned to a single data line in random order. Thus, the encoding used by the data line may rotate through different mappings of a symbol to a data value. In various embodiments, dynamically and periodically changing the symbols associated with data values may provide additional security during data transmission because a third party that may be monitoring the data transmission might not be able to follow the changes.

According to various embodiments, the encoding pattern implemented in RAM cell array 102 and RAM cell array 110 may be modified dynamically to compensate for ambient conditions which might not be immediately apparent to a designer or system engineer. For example, long run lengths or sudden changes in patterns may generate resonances in the transmission line, chip pin, package, or decoupling capacitors. In various embodiments, circuit 100 may be coupled to a computer system that is configured to monitor data transmitted from a transmitter to a receiver within circuit 100. The computer system may be configured to run test patterns for several different encoding schemes and record an error rate for each one. The computer system may be further configured to determine which encoding scheme resulted in the lowest error rate, and further configured to configure RAM cell array 102 and RAM cell array 110 to operate in accordance with that encoding scheme.

Figure 2:
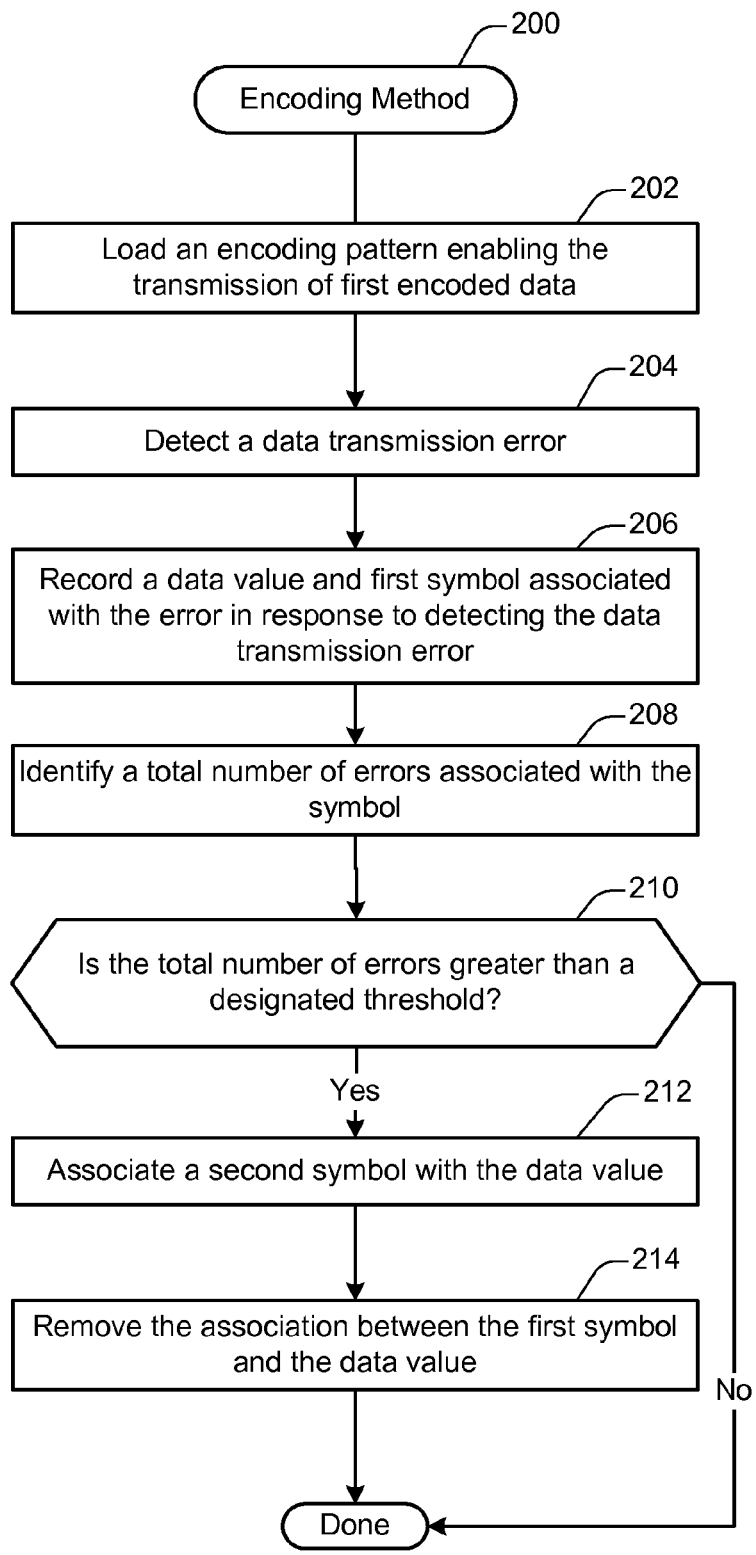
FIG. 2 illustrates an exemplary method for encoding data, implemented in accordance with some embodiments.

FIG. 2 illustrates an exemplary method for encoding data, implemented in accordance with some embodiments. In various embodiments, some particular symbols may be prone to higher error rates than other symbols. Thus, a first symbol may be received and misinterpreted more often than a second symbol. In some embodiments, this may be due to ambient conditions or resonant characteristics of hardware used in the process of transmitting the data. Thus, according to various embodiments, encoding method 200 may identify problematic symbols that result in high error rates and replace them with less problematic symbols. Moreover, in various embodiments, encoding method 200 may be performed dynamically while the transmitting and receiving devices are operational. Thus, encoding method 200 may be performed without interrupting the transmission of data over the data line or channel.

At step 202, an encoding pattern may be loaded. In various embodiments, the encoding pattern may be a line encoding scheme. For example, the line encoding scheme may be an encoding scheme such as 8b10b, Interlaken 64-67, PCIE, or Ethernet 64-66. In some embodiments, the encoding pattern is loaded into a RAM cell array of a transmitter in a data line. In various embodiments, a corresponding decoding pattern is loaded into a RAM cell array in the receiver in the data line. Thus, the transmitter and receiver may be configured to send and receive data in accordance with the encoding pattern.

At step 204, a data transmission error may be detected. In various embodiments a computer system may monitor data values sent by the transmitter and data values received by the receiver. In this instance, the computer system may be part of a diagnostic system used to diagnose problems with the data line. The computer system may be configured to compare the data value that was encoded and sent from the transmitter with the data value that is received and decoded by the receiver. If the data values do not match, a transmission error has occurred and may be detected by the computer system.

At step 206, a data value and a first symbol associated with the error may be recorded in response to detecting the transmission error. Thus, according to various embodiments, in response to detecting the error, the computer system may store one or more data values identifying the un-encoded data value and a first symbol associated with the un-encoded data value. In various embodiments, a symbol is an encoded representation of a data value that is encoded according to a line encoding scheme. For example, the first symbol may be an encoded representation of a data value encoded according to the 8b10b encoding scheme.

At step 208, a total number of errors associated with the symbol may be identified. Thus, according to various embodiments, the computer system may continue to monitor the transmission of data over the data line. The computer system may record each instance of a data transmission error, and count the total number of errors that have occurred for a particular data value and a particular symbol over a period of time. If a particular symbol is prone to errors due to ambient conditions, hardware parameters, or any other reason, it will have a higher number of errors.

At step 210, it may be determined whether or not the total number of errors is greater than a designated threshold. In various embodiments, the total number of errors may be compared with a threshold value in order to determine whether or not the error rate is impermissibly high. In some embodiments, the computer system may be configured to compare the total number of errors with a previously determined threshold value. In some embodiments the threshold value may have been previously determined by a user or designer.

If the total number of errors is not greater than the designated threshold, encoding method 200 may continue monitoring the transmission line. However, if the total number of errors is greater than the designated threshold, encoding method may proceed to step 212.

At step 212, a second symbol may be associated with the data value. Thus, according to various embodiments, the computer system may modify the encoding pattern to change the association between the data value and the symbol. The computer system may dynamically configure the RAM cell arrays of the transmitter and the receiver to update the symbol that is associated with the data value. Once the RAM cell arrays of the transmitter and receiver have been updated, the data value will be encoded to the second symbol, and the second symbol will be decoded to the data value.

At step 214, the association between the first symbol and the data value may be removed. Thus, according to various embodiments, the RAM cell arrays of the transmitter and the receiver may be further configured to remove the association between the first symbol and the data value. Once the association has been removed, the data value will no longer be encoded to the first symbol, and the first symbol will no longer be decoded to the data value. In various embodiments, the first symbol may remain unassociated with any data value until reassigned. Thus, the first symbol may be re-used at a later time.

In various embodiments, the computer system may be configured to perform encoding method 200 automatically. Thus, the computer system may be configured to monitor traffic as a background process. The computer system may automatically detect and retire problematic symbols that have high error rates, as determined by a comparison with the threshold value. In some embodiments, the computer system may include one or more processors configured to execute a statistical analysis operative to identify symbols that have an acceptable error rate and further identify symbols that have an impermissibly high error rate. For example, the one or more processors may be configured to perform a Fourier decomposition of one or more frequency components of data collected over a period of time. The data may identify different symbols used in an encoding scheme and further identify errors associated with each symbol over a period of time, as determined by a comparison of the transmitted value with the decoded received value. The period of time may be a period of operation of the device, such as a testing period. In various embodiments, the one or more processors may be configured to execute a Fourier decomposition of the collected data to isolate and identify one or more symbols that exhibit high error rates. Thus, the computer system may identify the frequency at which a symbol exhibits errors and compare the frequency with a designated threshold value. In various embodiments, the computer system may be configured to retire the symbol if the frequency is above the designated threshold value. Because, the transmitter and receiver can be reconfigured dynamically, problematic symbols may be retired without interrupting traffic on the data line.

Figure 3:
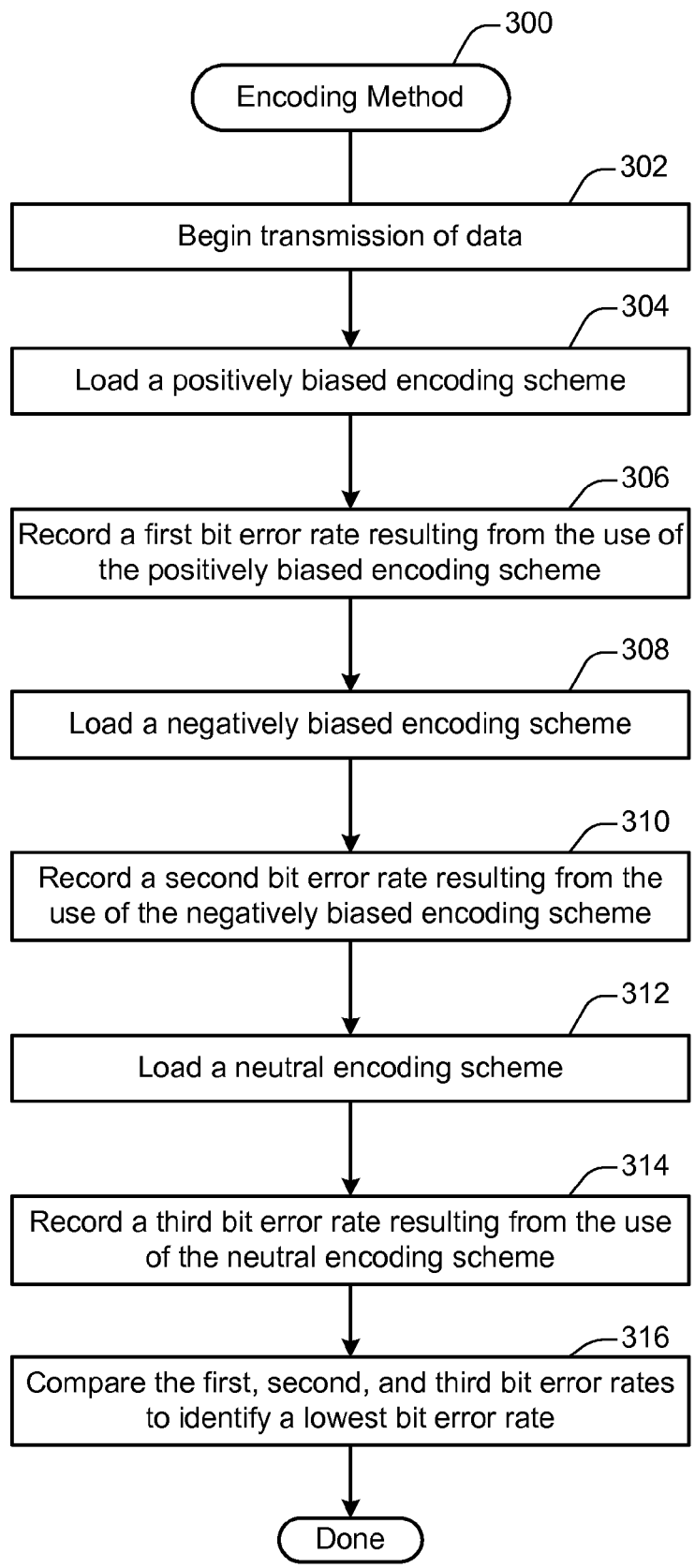
FIG. 3 illustrates another exemplary method for encoding data, implemented in accordance with some embodiments.

FIG. 3 illustrates another exemplary method for encoding data, implemented in accordance with some embodiments. In various embodiments, an encoding scheme that predominantly has values of one or zero may induce resonant behavior in hardware used to transmit data over a data line. For example, an encoding scheme that uses predominantly ones may have a high error rate due to irregularities in decoupling capacitors and differential transmitter and receiver buffers. In some embodiments, an encoding scheme that uses predominantly ones might have a low error rate. In various embodiments, an encoding scheme that uses predominantly ones may be referred to as a positively biased encoding scheme. In some embodiments, an encoding scheme that uses predominantly zeros may be referred to as a negatively biased encoding scheme. In particular embodiments, an encoding scheme that uses approximately an equal number of ones and zeros may be referred to as a neutral encoding scheme. Whether or not a positively biased, neutral, or negatively biased encoding scheme results in a higher or lower error rate depends upon the characteristics of the hardware used to transmit the data over the data line or channel. Thus, according to various embodiments, encoding method 200 may use a positively biased, neutral, and negatively biased encoding scheme, record an error rate for each one, and determine which encoding scheme results in the lowest data transmission error rate.

At step 302, the transmission of one or more data values may begin. In various embodiments, the transmission of the one or more data values may be from a transmitter in a data line to a receiver in a data line. The one or more data values may be transmitted in accordance with an encoding pattern or scheme.

At step 304, a positively biased encoding scheme may be loaded. In various embodiments, a computer system may be used to configure a RAM cell array in the transmitter and a RAM cell array in the receiver to operate in accordance with a positively biased encoding scheme. In various embodiments, the positively biased encoding scheme may be an encoding scheme in which data values are mapped or encoded to symbols that are represented by more positive data values than negative or neutral data values. For example, in a positively biased encoding scheme, the symbols may be binary numbers including more ones than zeros.

At step 306, a first bit error rate resulting from the use of the positively biased encoding table may be recorded. Thus, a computer system may monitor the transmission of data values from the transmitter to the receiver over a period of time and record a total number of transmission errors that occurs during a time period when the positively biased encoding scheme is used.

At step 308, a negatively biased encoding scheme may be loaded. In various embodiments, the computer system may configure the RAM cell array of the transmitter and the RAM cell array of the receiver to operate in accordance with a negatively biased encoding scheme. In various embodiments, the negatively biased encoding scheme may be an encoding scheme in which data values are mapped or encoded to symbols that are represented by more negative or neutral data values than positive data values. For example, in a negatively biased encoding scheme, the symbols may be binary numbers including more zeros than ones.

At step 310, a second bit error rate resulting from the use of the negatively biased encoding table may be recorded. Thus, a computer system may monitor the transmission of data values from the transmitter to the receiver over a period of time and record a total number of transmission errors that occurs during a time period when the negatively biased encoding scheme is used.

At step 312, a neutral encoding scheme may be loaded. In various embodiments, the computer system may configure the RAM cell array of the transmitter and the RAM cell array of the receiver to operate in accordance with a neutral encoding scheme. In various embodiments, the neutral encoding scheme may be an encoding scheme in which data values are mapped or encoded to symbols that are represented by an equal number of negative or neutral data values and positive data values. For example, in a neutral encoding scheme, the symbols may be binary numbers including the same number of zeros and ones.

At step 314, a third bit error rate resulting from the use of the neutral encoding table may be recorded. Thus, a computer system may monitor the transmission of data values from the transmitter to the receiver over a period of time and record a total number of transmission errors that occurs during a time period when the neutral encoding scheme is used.

At step 316, the first, second, and third bit error rates may be compared to identify a lowest bit error rate. Thus, according to various embodiments, the computer system may retrieve and compare the first, second, and third bit error rates and determine which error rate is the lowest. Once the lowest error rate is determined, the computer system may determine which encoding scheme is associated with the lowest error rate and implement that encoding scheme. For example, if the computer system determines that the first error rate is the lowest, the computer system may identify the positively biased encoding scheme as being associated with the first error rate, and may configure the transmitter and receiver to operate in accordance with the positively biased encoding scheme.

In various embodiments, encoding method 300 may be performed on a link by link basis. Therefore, in devices that include multiple data lines transmitting data in parallel, the different data lines may be configured individually, and an encoding scheme with a lowest bit rate may be chosen and implemented for each data line. Thus, a first data line may be configured to use a positively biased encoding scheme while a second data line may be configured to use a negatively biased encoding scheme.

Figure 4:
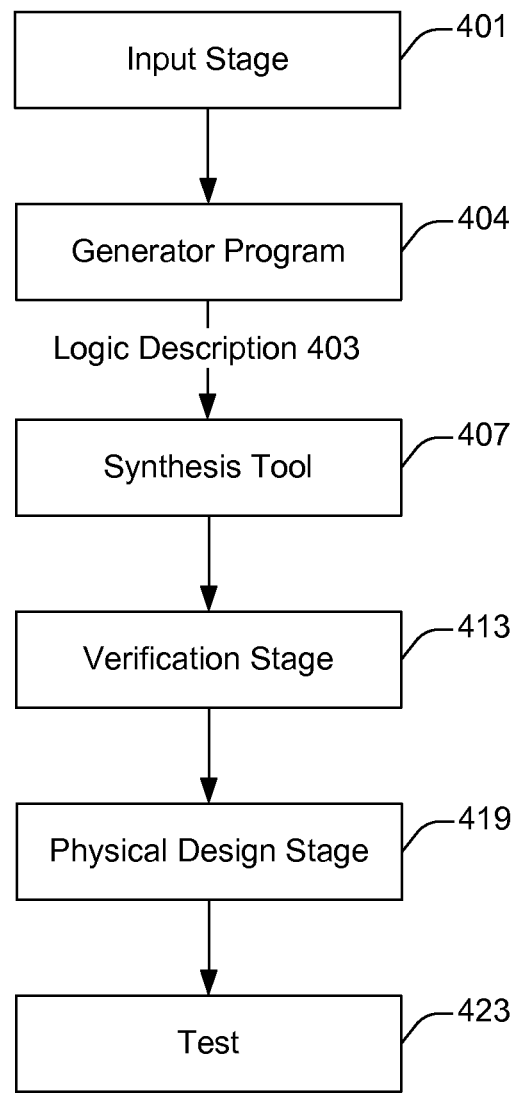
FIG. 4 illustrates an exemplary technique for implementing, on a programmable chip, an encoding scheme in a reprogrammable logic region within a device, such as a transceiver, in accordance with some embodiments.

FIG. 4 illustrates an exemplary technique for implementing, on a programmable chip, an encoding scheme in a reprogrammable logic region within a device, such as a transceiver, in accordance with some embodiments. Such a technique may be used to implement a programmable logic device (PLD), as discussed above. An input stage 401 receives selection information typically from a user for logic such as a processor core as well as other components to be implemented on an electronic device. In one example, the input received is in the form of a high-level language program. A generator program 405 creates a logic description 403 and provides the logic description along 403 with other customized logic to any of a variety of synthesis tools, place and route programs, and logic configuration tools to allow a logic description to be implemented on an electronic device.

In one example, an input stage 401 often allows selection and parameterization of components to be used on an electronic device. The input stage 401 also allows configuration of hard coded logic. In some examples, components provided to an input stage include intellectual property functions, megafunctions, and intellectual property cores. The input stage 401 may be a graphical user interface using wizards for allowing efficient or convenient entry of information. The input stage may also be a text interface or a program reading a data file such as a spreadsheet, database table, or schematic to acquire selection information. The input stage 401 produces an output containing information about the various modules selected. At this stage, the user may enter security information about individual components that needs to be isolated. For example, different levels of component security and which components are allowed to communicate with each other may be entered.

In typical embodiments, the generator program 405 can identify the selections and generate a logic description with information for implementing the various modules. The generator program 405 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 405 identifies pointers and provides ports for each pointer. One tool with generator program capabilities is System on a Programmable Chip (SOPC) Builder available from Altera Corporation of San Jose, Calif. The generator program 405 also provides information to a synthesis tool 407 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 401, generator program 405, and synthesis tool 407 can be separate programs. The interface between the separate programs can be a database file, a log, or simply messages transmitted between the programs. For example, instead of writing a file to storage, the input stage 401 can send messages directly to the generator program 405 to allow the generator program to create a logic description. Similarly, the generator program can provide information directly to the synthesis tool instead of writing HDL files. Similarly, input stage 401, generator program 405, and synthesis tool 407 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 407.

A synthesis tool 407 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 413 typically follows the synthesis stage 407. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 413, the synthesized netlist file can be provided to physical design tools 419 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 423.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 401, the generator program 405, the synthesis tool 407, the verification tools 413, and physical design tools 419 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 5:
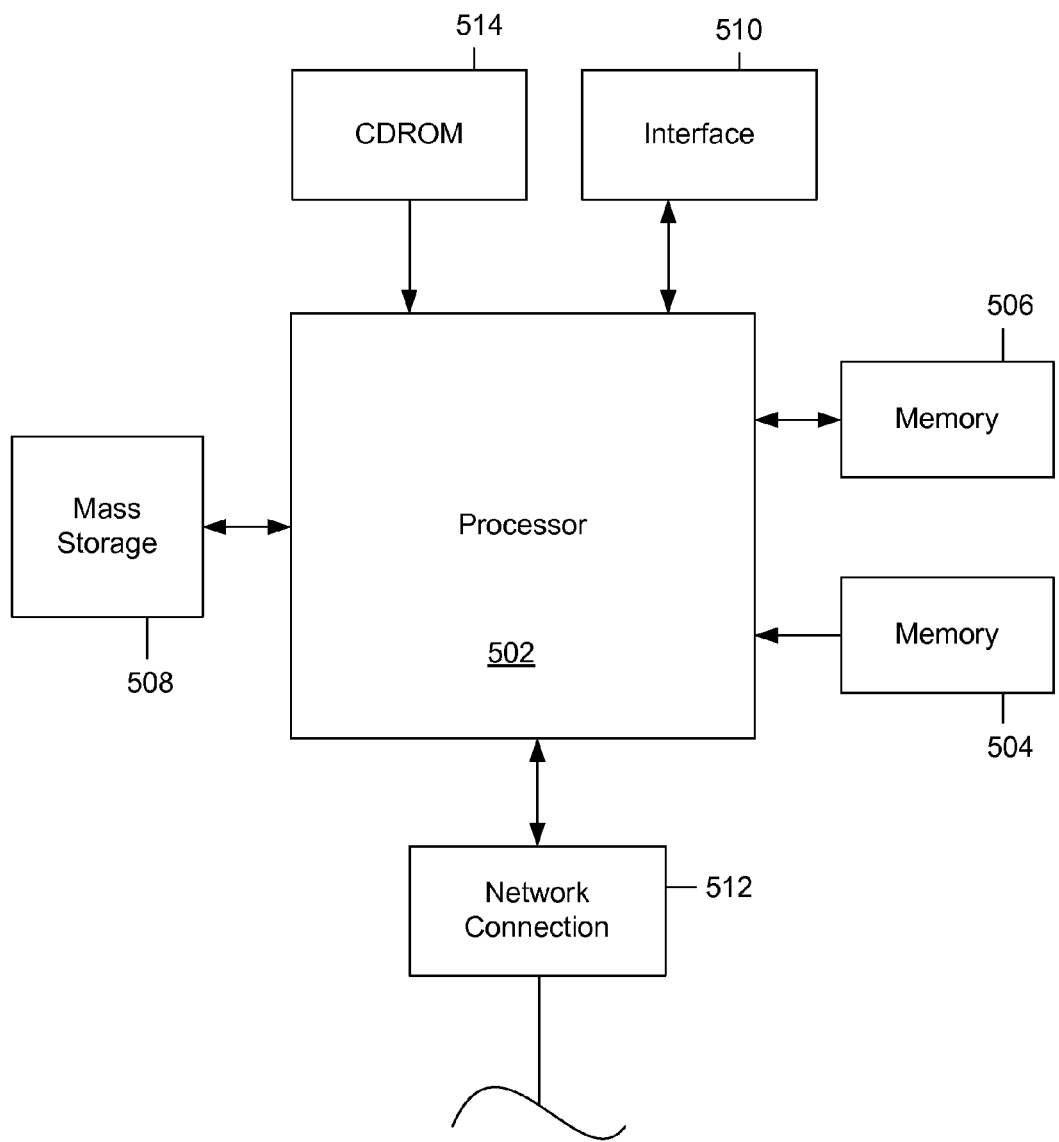
FIG. 5 illustrates one example of a computer system according to some embodiments.

FIG. 5 illustrates one example of a computer system according to some embodiments. The computer system 500 includes any number of processors 502 (also referred to as central processing units, or CPUs) that are coupled to devices including memory component 506 (typically a random access memory, or "RAM"), memory component 504 (typically a read only memory, or "ROM"). The processors 502 can be configured to generate an electronic design. As is well known in the art, memory component 504 acts to transfer data and instructions uni-directionally to the CPU and memory component 506 are used typically to transfer data and instructions in a bi-directional manner.

Both of these memory devices may include any suitable type of the computer-readable media described above. A mass storage device 508 is also coupled bi-directionally to CPU 502 and provides additional data storage capacity and may include any of the computer-readable media described above. The mass storage device 508 may be used to store programs, data and the like and is typically a secondary storage medium such as a hard disk that is slower than memory. The mass storage device 508 can be used to hold a library or database of prepackaged logic or intellectual property functions, as well as information on generating particular configurations. It will be appreciated that the information retained within the mass storage device 508, may, in appropriate cases, be incorporated in standard fashion as part of memory component 506 as virtual memory. A specific mass storage device such as a CD-ROM 514 may also pass data uni-directionally to the CPU.

CPU 502 is also coupled to an interface 510 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 502 may be a design tool processor. Finally, CPU 502 optionally may be coupled to a computer or telecommunications network using a network connection as shown generally at 512. With such a network connection, it is contemplated that the CPU might receive information from the network, or might output information to the network in the course of performing the above-described process steps. It should be noted that the system 500 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A system comprising:
a first input for receiving a first data value;
a memory device for providing a second data value based on the first data value, wherein the second data value is a representation of the first value according to a first scheme; and
a first output for providing the second data value.

2. The system of claim 1, wherein the second data value allows for clock recovery, and wherein the first scheme is a line encoding scheme.

3. The system of claim 1, wherein the second data value is also based on an arithmetic operation associated with the first data value.

4. The system of claim 1, wherein the memory device is further for providing a third data value based on the first data value, wherein the third data value is a representation of the first value according to a second scheme.

5. The system of claim 4, further comprising:
a second output for providing the third data value.

6. The system of claim 5, wherein the second output is adjacent to the first output.

7. The system of claim 1, further comprising:
a processor for providing the first scheme to the memory device.

8. The system of claim 7, wherein the processor is also for providing a second scheme to the memory device, the second scheme provided to the first memory based on a first error rate associated with the first scheme.

9. The system of claim 7, wherein the processor is also for providing a second scheme and a third scheme to the memory device, wherein the first scheme is associated with a first error rate, the second scheme is associated with a second error rate, and the third scheme is associated with a third error rate, and wherein the processor is also for determining a lowest error rate among the first error rate, the second error rate, and the third error rate.

10. The system of claim 9, wherein the first scheme is associated with a first scheme type, the second scheme is associated with a second scheme type, and the third scheme is associated with a third scheme type, the scheme types selected from the group consisting of: a positively biased scheme using more high bits than low bits, a negatively biased scheme using more low bits than high bits, and a neutral scheme using equal amounts of high bits and low bits.

11. A method comprising:
receiving a first data value at a first input port of a memory device;
identifying a second data value based on the first data value, wherein the second data value is a representation of the first value according to a first scheme in the memory device; and
providing the second data value at a first output port of the memory device.

12. The method of claim 11, wherein the second data value allows for clock recovery, and wherein the first scheme is a line encoding scheme.

13. The method of claim 11, wherein the second data value is also based on an arithmetic operation associated with the first data value.

14. The method of claim 11, further comprising:
providing, at a second output port, a third data value based on the first data value, wherein the third data value is a representation of the first value according to a second scheme.

15. The method of claim 14, wherein the second output port is adjacent to the first output port.

16. The method of claim 11, further comprising:
receiving a second scheme, the second scheme provided to the memory device based on a first error rate associated with the first scheme.

17. The method of claim 11, further comprising:
receiving a second scheme and a third scheme, wherein the first scheme is associated with a first error rate, the second scheme is associated with a second error rate, and the third scheme is associated with a third error rate; and
determining a lowest error rate among the first error rate, the second error rate, and the third error rate.

18. The method of claim 17, wherein the first scheme is associated with a first scheme type, the second scheme is associated with a second scheme type, and the third scheme is associated with a third scheme type, the scheme types selected from the group consisting of: a positively biased scheme using more high bits than low bits, a negatively biased scheme using more low bits than high bits, and a neutral scheme using equal amounts of high bits and low bits.

19. A non-transitory computer readable medium having instructions stored thereon, the instructions executable by a device to:
receive a first data value at a first input port of the device;
identify a second data value based on the first data value, wherein the second data value is a representation of the first value according to a first scheme in the device; and
provide the second data value at a first output port of the device.

20. The non-transitory computer readable medium of claim 19, wherein the instructions are further executable by the device to:
receive a second scheme and a third scheme, wherein the first scheme is associated with a first scheme type, the second scheme is associated with a second scheme type, and the third scheme is associated with a third scheme type, the scheme types selected from the group consisting of: a positively biased scheme using more high bits than low bits, a negatively biased scheme using more low bits than high bits, and a neutral scheme using equal amounts of high bits and low bits.

21. A method for providing a scheme to a memory device, the method comprising:
providing, by a computer system, a first scheme for providing a second data value based on a first data value;
receiving, on the computer system, the first data value associated with a first input port of a memory device; and
receiving, on the computer system, the second data value associated with a first output port of the memory device, wherein the second data value is a representation of the first data value according to the first scheme.

22. The method of claim 21, further comprising:
providing, by the computer system, a second scheme and a third scheme, wherein the first scheme is associated with a first error rate, the second scheme is associated with a second error rate, and the third scheme is associated with a third error rate; and
determining, by the computer system, a lowest error rate among the first error rate, the second error rate, and the third error rate, and wherein the first scheme is associated with a first scheme type, the second scheme is associated with a second scheme type, and the third scheme is associated with a third scheme type, the scheme types selected from the group consisting of: a positively biased scheme using more high bits than low bits, a negatively biased scheme using more low bits than high bits, and a neutral scheme using equal amounts of high bits and low bits.

* * * * *